US010056041B1

(12) United States Patent
Ma

(10) Patent No.: US 10,056,041 B1
(45) Date of Patent: Aug. 21, 2018

(54) SHIFT REGISTER UNIT, ARRAY SUBSTRATE, DISPLAY PANEL, DISPLAY APPARATUS, AND DRIVING METHOD THEREOF

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/542,270

(22) PCT Filed: Jan. 25, 2017

(86) PCT No.: PCT/CN2017/072555
§ 371 (c)(1),
(2) Date: Jul. 7, 2017

(87) PCT Pub. No.: WO2017/193644
PCT Pub. Date: Nov. 16, 2017

(30) Foreign Application Priority Data

May 13, 2016 (CN) .......................... 2016 1 0318730

(51) Int. Cl.
*G09G 5/00* (2006.01)
*G09G 3/3266* (2016.01)
(Continued)

(52) U.S. Cl.
CPC ......... *G09G 3/3266* (2013.01); *G09G 3/3225* (2013.01); *G11C 19/28* (2013.01);
(Continued)

(58) Field of Classification Search
CPC .... G09G 3/3225; G09G 3/325; G09G 3/3266; G09G 3/3275; G09G 3/3677;
(Continued)

(56) References Cited

U.S. PATENT DOCUMENTS

2004/0196275 A1* 10/2004 Hattori ................. G09G 3/3216
345/204
2011/0001732 A1 1/2011 Morii et al.
(Continued)

FOREIGN PATENT DOCUMENTS

CN 1758321 A 4/2006
CN 101939791 A 1/2011
(Continued)

OTHER PUBLICATIONS

First Office Action in the Chinese Patent Application No. 201610318730.5, dated Oct. 10, 2017; English translation attached.
(Continued)

*Primary Examiner* — Joe H Cheng
(74) *Attorney, Agent, or Firm* — Intellectual Valley Law, P.C.

(57) ABSTRACT

The present application discloses a shift register unit and method thereof. The shift register unit includes an output port for outputting a driving signal. The shift register unit further includes a first output node control sub-circuit for controlling an emission control signal from an emission control line to be applied to a first output control node when the first clock signal is at a first level. The shift register unit further includes a first output sub-circuit and a second output sub-circuit. The shift register unit furthermore includes a second output node control sub-circuit for controlling a start signal being applied to a second output control node when a second clock signal is at the first level and controlling a second level being applied to the second output control node when the emission control signal is at the first level. The emission control signal is used to generate the driving signal.

18 Claims, 4 Drawing Sheets

(51) Int. Cl.
*G09G 3/3225* (2016.01)
*G11C 19/28* (2006.01)

(52) U.S. Cl.
CPC ............. *G09G 2310/0286* (2013.01); *G09G 2310/061* (2013.01)

(58) Field of Classification Search
CPC ............ G09G 2310/0286; G11C 19/00; G11C 19/28; G11C 19/184; H03K 17/063
See application file for complete search history.

(56) References Cited

U.S. PATENT DOCUMENTS

| | | | | |
|---|---|---|---|---|
| 2011/0069044 A1* | 3/2011 | Lee | ......................... | G11C 19/28 345/204 |
| 2013/0033468 A1* | 2/2013 | Takahashi | ................ | G09G 3/20 345/204 |
| 2014/0191935 A1* | 7/2014 | Morii | ................... | G09G 3/3677 345/92 |
| 2015/0170568 A1 | 6/2015 | Lee et al. | | |
| 2016/0163401 A1* | 6/2016 | Nonaka | ................... | G11C 19/28 345/214 |
| 2016/0225341 A1* | 8/2016 | Ma | ............................. | G09G 3/20 |
| 2016/0329015 A1* | 11/2016 | Ji | ............................... | G09G 3/32 |
| 2017/0154602 A1 | 6/2017 | Sun | | |
| 2017/0169757 A1* | 6/2017 | Kim | ...................... | G09G 3/2092 |
| 2017/0186378 A1* | 6/2017 | Na | ........................ | G09G 3/3266 |
| 2018/0082642 A1* | 3/2018 | Yamanaka | ............ | G09G 3/3291 |

FOREIGN PATENT DOCUMENTS

| | | |
|---|---|---|
| CN | 103000155 A | 3/2013 |
| CN | 104318904 A | 1/2015 |
| CN | 104537980 A | 4/2015 |
| CN | 104821148 A | 8/2015 |
| CN | 105761757 A | 7/2016 |

OTHER PUBLICATIONS

International Search Report & Written Opinion dated Apr. 24, 2017 regarding PCT/CN2017/072555.

* cited by examiner

SHIFT REGISTER UNIT, ARRAY SUBSTRATE, DISPLAY PANEL, DISPLAY APPARATUS, AND DRIVING METHOD THEREOF

CROSS-REFERENCE TO RELATED APPLICATION

This application is a national stage application under 35 U.S.C. § 371 of International Application No. PCT/CN2017/072555 filed Jan. 25, 2017, which claims priority to Chinese Patent Application No. 201610318730.5, filed May 13, 2016, the contents of which are incorporated by reference in the entirety.

TECHNICAL FIELD

The present invention relates to display technology, more particularly, to a shift register unit, an array substrate, a display panel, a display apparatus, and a driving method thereof.

BACKGROUND

In a typical pixel structure based on active matrix organic light emitting diode (AMOLED), at least an emission control shift register and separately a scanning shift register are needed for achieving a pixel compensation function. The emission control shift register provides an emission control signal to an emission control line of a pixel circuit, and keep light emitting diode always on during the light-emitting period. The scanning shift register provides a driving signal to a gate line of the array substrate to control image data input.

SUMMARY

In one aspect, the present disclosure provides a shift register unit for providing a driving signal for a gate line of an array substrate, the shift register unit comprising an output port for a driving signal; a first output node control sub-circuit coupled to an emission control line, a first clock input port, and, a first output control node respectively, and configured to control a potential level of the emission control signal being applied from the emission control line to the first output control node when a first clock signal from the first clock input port is at a first level and to maintain the potential level of the first output control node when the first clock signal is at a second level; a first output sub-circuit coupled to the first output control node, the output port, and a second voltage input port respectively, the second voltage input port supplying a potential level at the second level; a second output node control sub-circuit coupled to the emission control line, the second voltage input port, a second clock input port, a primitive signal input port, and a second output control node respectively, and configured to control a start signal from the primitive signal input port being applied to the second output control node when a second clock signal from the second dock input part is at the first level, to control the second level being applied to the second output control node when the potential level of the emission control signal is at the first level, and to maintain the potential level of the second output control node when both the first clock signal and the potential level of the emission control signal are at the second level; and a second output sub-circuit coupled to the second output control node, the output pun, and the first clock input port respectively.

Optionally, the first output sub-circuit is configured to control the second potential level being outputted at the output port when the potential level of the first output node is at the first level; the second output sub-circuit is configured to control the first clock signal being outputted at the output port when the potential level of the second output control node is at the first level.

Optionally, the first output node control sub-circuit comprises a first control transistor having a gate connected to the first clock input port, a first terminal connected to the emission control line, and the second terminal connected to the first output control node; a first capacitor having a first terminal connected to the second voltage input port and a second terminal connected to the first output control node.

Optionally, the second output node control sub circuit comprises a second control transistor having a gate connected to the second clock input port, a first terminal connected to the primitive input signal input port, and a second terminal connected to the second output control node; a third control transistor having a gate connected to the emission control line, a first terminal connected to the second output control node, and the second terminal connected to the second voltage input port; and a second capacitor having a first terminal connected to the output port and a second terminal connected to the first clock input port.

Optionally, the first output sub-circuit comprises a first output transistor having a gate connected to the first output control node, a first terminal connected to the output port, and a second terminal connected to the second voltage input port; the second output sub-circuit comprises a second output transistor having a gate connected to the second output control node, a first terminal connected to the first clock input port, and a second terminal connected to the output port.

In another aspect, the present disclosure provides a method for driving a shift register unit in each period for scanning a subpixel including a primitive phase, an input phase, an output phase, a reset phase, and an output cut-off phase, the method comprising in the primitive phase, setting potential levels of the emission control signal and the first clock signal to the first level, setting potential levels of the start signal and the second clock signal to the second level, applying the emission control signal at the first level to the first output control node controlled by the first output node control sub-circuit, controlling the potential level of the first output control node at the first level, and applying the second level to the second output control node controlled by the second output node control sub-circuit; in the input phase, setting, potential levels of the start signal and the second clock signal to the first level, setting potential levels of the emission control signal and the first clock signal to the second level, maintaining the first output control node at the first level controlled by the first output node control sub-circuit, controlling the start signal being received by the second output control node controlled by the second output node control sub-circuit for controlling the second output control node to be at the first level; in the output phase, setting potential level of the first clock signal to the first level, setting potential levels of the second clock signal, the start signal, and the emission control signal to the second level, controlling the first output control node to receive the emission control signal controlled by first output node control sub-circuit for controlling the first output control node to the second level, maintaining the second output control node at the first level controlled by the second output node control sub-circuit; in the reset phase, setting potential levels of the first clock signal and the start signal to the second level, setting potential levels of the second clock signal and the emission control signal to the first level, controlling the second level of the start signal being applied to the second output control node controlled by the second output node control sub-circuit for controlling the second output control node to the second level, maintaining the first output control node to the second level controlled by the first output node control sub-circuit; and in the output cut-off phase, controlling the first output control node to the first level controlled by the first output node control sub-circuit, controlling the second output control node to the second level controlled by the second output node control sub-circuit.

Optionally, in a first period of the output cut-off phase, setting potential levels of the first clock signal and the emission control signal to the first level, setting potential levels of the second clock signal and the start signal to the second level, controlling the emission control signal being applied to the first output control node controlled by the first output node control sub-circuit for controlling the first output control node to the first level, controlling the second level being applied to the second output control node controlled by the second output node control sub-circuit; in a second period of the output cut-off phase, setting potential levels of the second clock signal and the emission control signal to the first level, setting potential levels of the first clock signal and the start signal to the second level, controlling the first output control node to the first level controlled by the first output node control sub-circuit, and controlling the second level being applied to the second output control node controlled by the second output node control sub-circuit; restarting a first period of the output cut-off phase after the end of the second period of the output cut-off phase followed by a second period of the output cut-off phase again until a total time period of the output cut-off phase ends.

Optionally, the method, further comprises, in a maintaining phase between the output phase and the reset phase, setting potential levels of the first clock signal, the second clock signal, the start signal, and the emission control signal to the second level and maintaining the second output control node at the first level controlled by the second output node control sub-circuit.

Optionally, the method further comprises, in the primitive phase, driving the first output sub-circuit to control the output port to output the driving signal at the second level.

Optionally, the method further comprises, in the input phase, connecting the output port to the second voltage input port controlled by the first output sub-circuit, connecting the output port to the first clock input port controlled by the second output sub-circuit, and controlling output port to output the driving signal at the second level commonly controlled by the first output sub-circuit and the second output sub-circuit.

Optionally, the method further comprises, in the output phase, connecting the output port to the first clock input port controlled by the second output sub-circuit for controlling the output port to output the driving signal at the first level.

Optionally, the method further comprises, in the maintaining phase, connecting the output port to the first clock input port controlled by the second output sub-circuit for controlling the output port to output the driving signal at the second level.

Optionally, the method further comprises, in the reset phase, controlling the output port to continue outputting the driving signal at the second level controlled by the first output sub-circuit and the second output sub-circuit.

Optionally, the method further comprises, in the output cut-off phase, controlling the output port to output the driving signal at the second level controlled by the first output sub-circuit.

In another aspect, the present disclosure provides an array substrate comprising a plurality of emission control lines and a plurality of gate lines, and a plurality of shift register units described herein, each of the plurality of shift register units being coupled to one of the plurality of emission control lines and being configured to generate a driving signal outputted to one of the plurality of gate lines.

In another aspect, the present disclosure provides a display panel comprising an array substrate described herein.

In another aspect, the present disclosure provides a display apparatus comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Conventional scanning shift register for generating the driving signal does not use the emission control signal as a trigger signal. In other words, both the scanning shift register and the emission control shift register are designed independently rather than designed as an embedded system, resulting in a relatively complicated structure for the scanning shift register.

Accordingly, the present disclosure provides, inter alia, a shift register unit, an array substrate, a display panel, a display apparatus, and a driving method that substantially obviate one or more of the problems due to limitations and disadvantages of the related art. In one aspect, the present disclosure provides a shift register unit for providing a driving signal for a gate line of an array substrate. In some embodiments, the shift register unit includes an output port for a driving signal; a first output node control sub-circuit coupled to an emission control line, a first clock input port, and a first output control node respectively, and configured to control a potential level of the emission control signal being applied from the emission control line to the first output control node when a first clock signal from the first clock input port is at a first level and to maintain the potential level of the first output control node when the first clock signal is at a second level; a first output sub-circuit coupled to the first output control node, the output port, and a second voltage input port respectively, the second voltage input port supplying a potential level at the second level; a second output node control sub-circuit coupled to the emission control line, the second voltage input port, a second clock input port, a primitive signal input port, and a second output control node respectively, and configured to control a start signal from the primitive signal input port being applied to the second output control node when a second clock signal from the second clock input port is at the first level, to control the second level being applied to the second output control node when the potential level of the emission control signal is at the first level, and to maintain the potential level of the second output control node when both the first clock signal and the potential level of the emission control signal are at the second level; and a second output sub-circuit coupled to the second output control node, the output port, and the first clock input port respectively.

Figure 1:
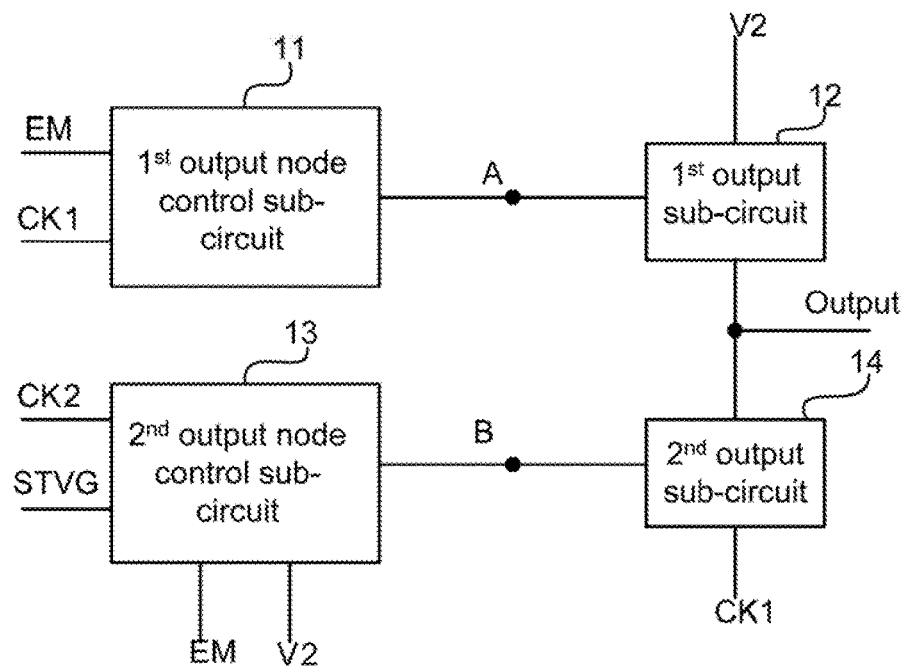
FIG. 1 is block diagram of a shift register unit according to some embodiments of the present disclosure.

FIG. 1 is block diagram of a shift register unit according to some embodiments of the present disclosure. Referring to FIG. 1, a shift register unit is provided for generating a driving signal for a gate line for row-by-row controlling array of subpixels in an array substrate for displaying images based on data signals via emission control lines to drive emissions of corresponding light-emitting diodes. As shown in FIG. 1, the shift register unit includes an output port OUTPUT for outputting a driving signal. Additionally, the shift register unit includes a first output node control sub-circuit 11, respectively coupled to an emission control line, a first clock input, port, and a first output control node A. The first output node control sub-circuit 11 is configured to control an emission control signal EM at the emission, control line being applied to the first output control node A when a first clock signal CK1 from the first clock input port is set to be a first potential level (first level). Further, the first output node control sub-circuit 11 is configured to maintain the potential level of the first output control node A when the first clock signal CK1 is set to a second potential level (second level). Optionally, in actual implementation of the shift register unit into the pixel driving circuit, the first level can be a low potential level and the second level can be a high potential level if the shift register unit is made substantially by p-type transistors. Alternatively, the first level can be a high potential level and the second level can be a low potential level if the shift register unit is made substantially by n-type transistors. Either option can be applied without affecting the operation principle of the shift register unit as disclosed throughout the specification.

Referring to FIG. 1, the shift register unit further includes a first, output sub-circuit 12, respectively coupled to the first output control node A, the output port OUTPUT, and a second voltage input port. The second voltage input port is configured to provide a voltage signal with the second potential level.

Furthermore, the shift register unit includes a second output node control sub-circuit 13, respectively coupled to the emission control line, the second voltage input port, a second clock input port, a primitive signal input port, and a second output control node B. The second output node control sub-circuit 13 is configured to control a start signal STVG being applied to the second output control node B when the second clock signal CK2 is set to the first level. Further, the second output node control sub-circuit 13 is configured to control the second level V2 received at the second control node B when the emission control signal EM is provided with the first level. Furthermore, the second output node control sub-circuit 13 is configured to maintain the potential level of the second control node B when both the potential levels of the first clock signal CK1 and the emission control signal are set to the second level.

Referring to FIG. 1, the shift register unit further includes a second output sub-circuit 14 respectively coupled to the second output control node B, the output port OUTPUT, and the first clock input port. In some embodiments, the shift register unit is designed to be implemented for driving pixel emission with compensation function. During each scan operation period, the emission control line outputs the emission control signal EM, the first clock signal CK1 is inputted from the first clock input port, the second clock signal CK2 is inputted from the second clock input port, the second potential level V2 is inputted from the second voltage input port, and the start signal STVG is inputted from the primitive signal input port. The shift register unit is configured to connect both the first output node control sub-circuit 11 and the second output node control sub-circuit 13 to the emission control line so that the emission control signal becomes a trigger signal for generating the driving signal. This circuitry structure substantially simplifies the shift register unit for generating each driving signal for each gate line and is facilitate for forming narrower frame of a display panel with cost reduction.

In some embodiments, a scanning shift register circuit can be made by a plurality of shift register units as disclosed above and uses always_on emission control lines in AMOLED pixel structure to provide emission control signals to trigger driving signal generation for all gate lines so that the emission control lines and the gate lines are mutually coupled in the AMOLED pixel structure, thereby simplifying the circuitry structure of the scanning shift register circuit.

In an implementation of the shift register unit as shown in FIG. 1, the first output sub-circuit 12 is configured to control the output port OUTPUT to output the driving signal at the second level V2 when the first output control node A is controlled to be the first level. The second output sub-circuit 14 is further configured to control the output port OUTPUT to output the driving signal at the first clock signal CK1 when the second output control node B is controlled to be the first level.

Figure 2:
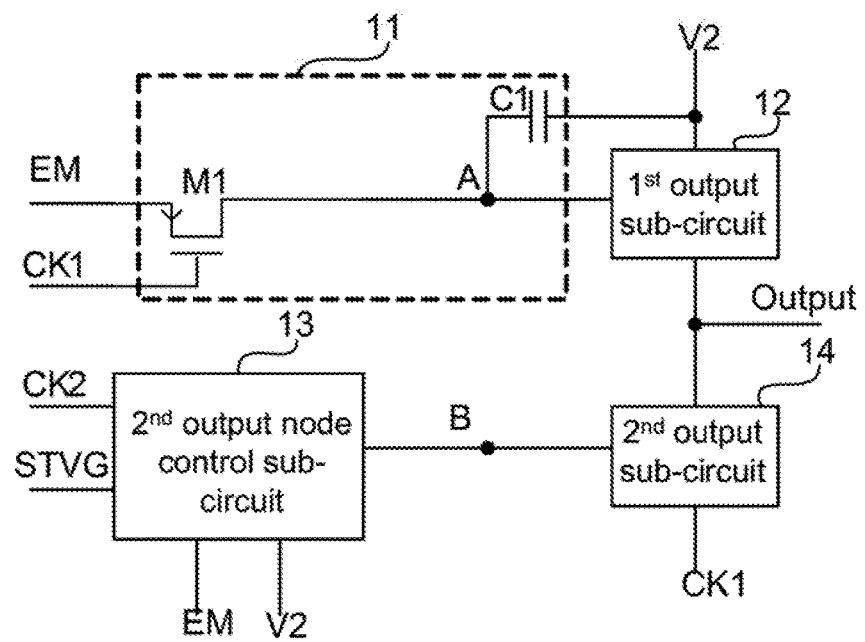
FIG. 2 is a block diagram of a shift register unit according to an embodiment of the present disclosure.

FIG. 2 is a block diagram of a shift register unit according to an embodiment of the present disclosure. Referring to FIG. 2, in this embodiment, the first output node control sub-circuit 11 includes a first control transistor M1 and a first capacitor C1. In particular, the first control transistor M1 has a gate connected to the first clock input port, a first terminal connected to the emission control line, and a second terminal connected to the first output control node A. The first capacitor C1 has a first terminal connected to the second voltage input port (receiving a voltage signal at the second potential level V2) and a second terminal connected to the first output control node A. In FIG. 1, the M1 is chosen to be a p-type transistor. In an alternative implementation, M1 can also be an n-type transistor. The disclosure is not intended to set limits to the type of transistor.

Referring to FIG. 2, during an operation of the shift register unit, when the first clock signal CK1 is at a low potential level, M1 is in conduction state so that CK1 is passed to the node A. When the first clock signal CK1 is at a high potential level, C1 maintains potential level of node A unchanged. During the operation, the emission control line outputs the emission control signal EM. The first clock signal CK1 is inputted from the first clock input port and the second clock signal CK2 is inputted from the second clock input port.

Figure 3:
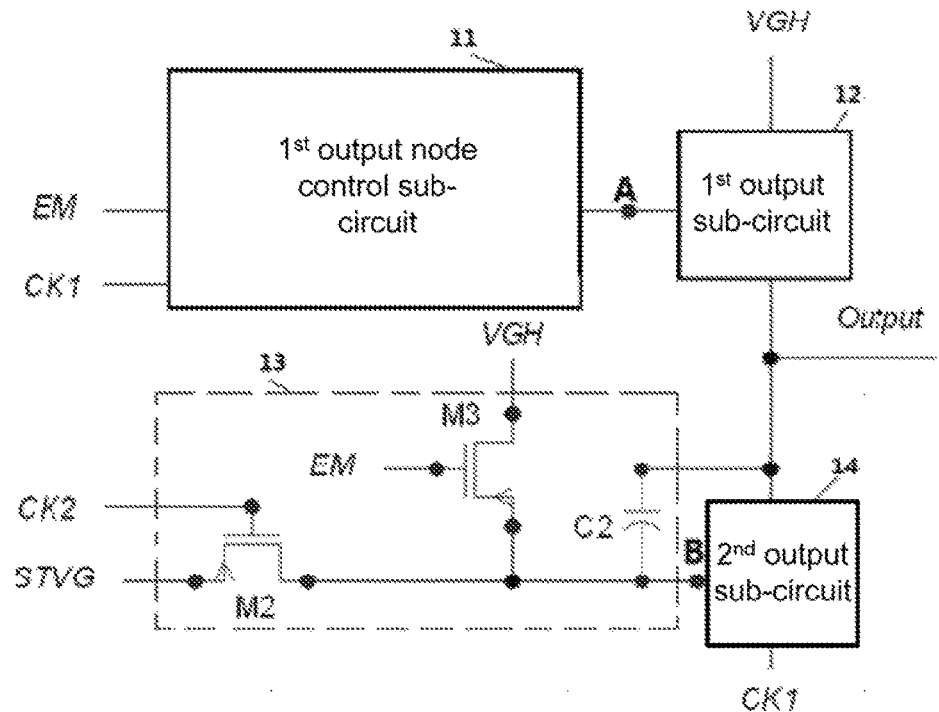
FIG. 3 is a block diagram of a shift register unit according to another embodiment of the present disclosure.

FIG. 3 is a block diagram of a shift register unit according to another embodiment of the present disclosure. Referring to FIG. 3, in this embodiment, the second output node control sub-circuit 13 includes a second control transistor M2, a third control transistor M3, and a second capacitor C2. The second control transistor M2 has a gate connected to the second clock input port, a first terminal connected to the primitive signal input port, and a second terminal connected to the second output control node 13. The third control transistor M3 has a gate connected to the emission control line, a first terminal connected to the second output control node B, and a second terminal connected to the second voltage input port. The second capacitor C2 has a first terminal connected to the output port OUTPUT and a second terminal connected to the first clock input port.

During the operation of the shift register unit, the second, clock signal CK2 is received from the second clock input port. The start signal STVG is provided from the primitive signal input port. The emission control line output the emission control signal EM. The second potential level V2 is a voltage signal provided from the second voltage input port. The first clock signal CK1 is received from the first clock input port.

In the implementation of the shift register unit shown in FIG. 3, M2 and M3 are selected to be p-type transistors. The second potential level V2 is set to a high level. In an alternative implementation, M2 and M3 can also be selected to be n-type transistors.

In particular, during an operation of the shift register unit of FIG. 3, if CK2 is set to a low potential level, M2 is in conduction state so that the start signal STVG is passed to the node B. As the emission control signal EM is provided with a low potential level, M3 is in conduction state so that the second potential level V2 is passed to the node B. When both CK2 and EM are at high potential level, transistor C2 maintains the potential level of node B unchanged.

Figure 4:
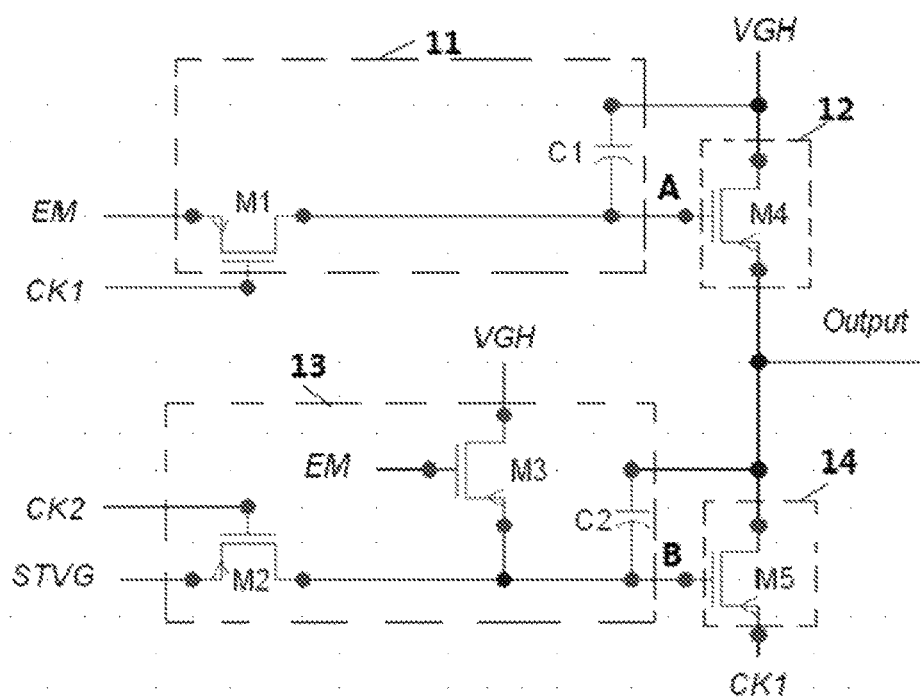
FIG. 4 is a circuit diagram of a shift register unit according to an embodiment of the present disclosure.

FIG. 4 is circuit diagram of a shift register unit according to an embodiment of the present disclosure. In the embodiment, the shift register unit includes an output port OUTPUT for outputting a driving signal. The shift register unit also includes a first output node control sub-circuit 11, a first output sub-circuit 12, a second output node control sub-circuit 13, and a second output sub-circuit 14. In an embodiment referring to FIG. 4, the first output sub-circuit 12 includes a first output transistor M4 and the second output sub-circuit 14 includes a second output transistor M5. M4 has a gate connected to the first output control node A, a first terminal connected to the output port OUTPUT, and a second terminal connected to the second voltage input port. M5 has a gate connected to the second output control node B, a first terminal connected to the first clock input port and a second terminal connected to the output port OUTPUT.

Referring to FIG. 4, the first output node control sub-circuit 11 includes a first control transistor M1 having a gate connected to the first clock input port, a source connected to the emission control lone, and a drain connected to the first output control node A. The first output node control sub-circuit 11 also includes a first capacitor C1 having first terminal connected a high-voltage input port and a second terminal connected to the first output control node A. A first clock signal CK1 is inputted from the first clock input port. An emission control signal EM is provided from the emission control line. The high-voltage input port provides a high-voltage level VGH.

Referring to FIG. 4, the second output node control sub-circuit 12 includes a second control transistor M2, a third control transistor M3, and a second capacitor C2. M2 has a gate connected to the second clock input port, a source connected to the primitive signal input port, and a drain connected to the second output control node B. M3 has a gate connected to the emission control line, a drain connected to the second output control node B, and a source connected to the high-voltage input port. The second capacitor C2 has a first terminal connected to the output port OUTPUT and a second terminal connected to the first clock input port. The second clock signal CK2 is inputted from the second clock input port.

Referring to FIG. 4 again, the first output sub-circuit 12 includes a first output transistor M4 having a gate connected to a first output control node A, a drain connected to the output port OUTPUT, and a source connected to the high-voltage input port. The second output sub-circuit 14 includes a second output transistor M5 having a gate connected to the second output control node B, a source connected to the first clock input port, and a drain connected to the output port OUTPUT. In FIG. 4, all transistors M1, M2, M3, M4, and M5 are p-type transistors.

In some embodiments, the emission control signal EM is a control signal for controlling LED light emitting in AMOLED pixel structure. Typically, the EM is outputted as a high-voltage signal only in a partial phase of a pulse cycle while outputted as low-voltage signal in all rest phases of the pulse cycle. In this way, the AMOLED pixel is properly controlled to emit light for image display. In particular, when the emission control signal is in a high-voltage cut-off state, a driving signal for controlling AMOLED data write just start to provide a low-voltage On signal for writing the data voltage signals into AMOLED pixel circuit structure. After data write, the driving signal is turned to a high-voltage Off signal. Then, the emission control signal is turned to a low-voltage On signal to allow the pixel LED to emit light with a corresponding intensity controlled by the data voltage signal written into the pixel structure.

Figure 5:
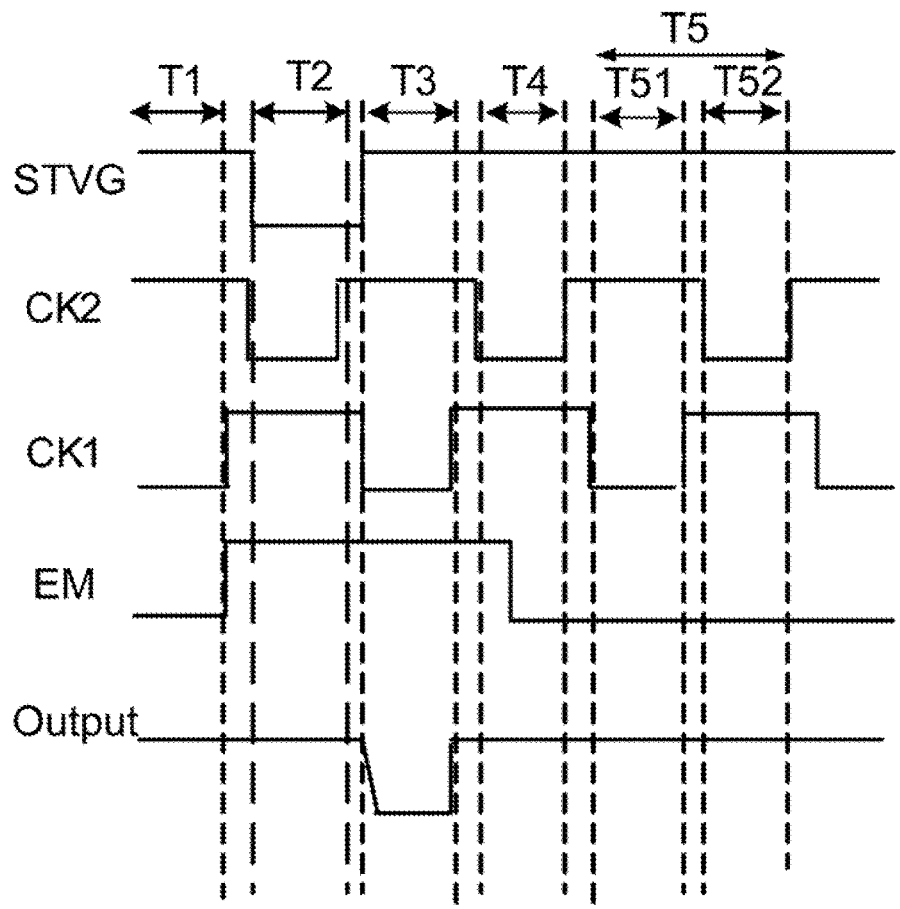
FIG. 5 is a timing waveform diagram for operating the shift register unit in AMOLED pixel structure according to an embodiment of the present disclosure.

FIG. 5 is a timing waveform diagram for operating the shift register unit in AMOLED pixel structure according to an embodiment of the present disclosure. The operation of the shift register unit is to use an emission control signal to trigger a generation of a driving signal for controlling data write into the AMOLED pixel structure. The operation of the shift register unit disclosed in FIG. 1 through FIG. 4 can be depicted in a timing waveform in a single scan period. The scan period includes at least a primitive phase T1, an input phase T2, an output phase T3, a reset phase T4, and an output cut-off phase T5. Referring to FIG. 5, in the primitive phase T1, the start signal STVG and second clock signal CK2 are high-voltage cut-off signals. First clock signal CK1 and emission control signal EM are low-voltage On signal. CK1 controls the first control transistor M1 being turned on so that EM signal is written to the first capacitor C1 and the first output transistor M4 is turned on so that a high-voltage level signal VGH is passed to the output port OUTPUT. At the same phase, emission control signal EM controls the third control transistor M3 being turned on so that the VGH signal is written to the second capacitor C2 and the second output transistor M5 is at an Off state.

Referring to FIG. 5, in the input phase T2, the start signal, STVG and the second clock signal CK2 are low-voltage On signal and the first clock signal CK1 and the emission control signal EM are high-voltage Off signal. In this phase, CK2 controls the second control transistor M2 being turned on so that STVG at low voltage level is written to the second capacitor C2 and the second output transistor M5 is turned on so that the CK1 at high voltage level is written to output port OUTPUT. In the same phase, the gate potential level of M4 remains at a low-voltage state maintained by the first capacitor C1 at the primitive phase T1. This ensures M4 being kept at an On state to continue write the VGH signal to the output port OUTPUT.

In the output phase T3, STVG, CK2, and EM are all high-voltage Off signals. CK1 is a low-voltage On signal. This low-voltage CK1 turns the first control transistor M1 on and write EM into C1 and makes M4 at an Off state. The low voltage of the first clock signal CK1 in T3 is changed from the high voltage in T2. This change induces a Bootstrap effect in a gate-source coupling capacitor of the second output transistor M5 to pull down the potential level of C2 so that the low-voltage CK1 is able to completely pass through M5 to the output port OUTPUT. Because the gate of the third control transistor M3 receives EM as a high-voltage Off signal so that M3 is at an Off state and the high-voltage VGH will not affect the potential level of C2.

In the reset phase T4, STVG and CK1 are high-voltage Off signals. CK2 and EM are low-voltage On signals. Between the output phase T3 and the reset phase T4, there is a gap period in which CK1, CK2, and EM are all high-voltage Off signals. But this gap period is set when the high-voltage CK1 is switched from a low-voltage level to a high-voltage level. Because the high-voltage CK2 controls the second control transistor M2 at an Off state and EM controls the third control transistor M3 also at an Off state, the second capacitor C2 still can keep gate potential level of the second output transistor M5 at a low potential level to keep M5 at an On state. At this time, because CK1 has changed from low-voltage level to high-voltage level, the signal passed to the output port OUTPUT is also switched from a low-voltage level to a high-voltage level. Now, it formally enters a reset phase T4. The second clock signal CK2 controls the second control transistor M2 being turned on so that the high-voltage STVG is written to C2 to keep M5 at an Off state. Additionally, because potential level of C1 can keep gate potential level of M4 at a high level acquired during the output phase T3, M4 is also kept at an Off state so that the potential level of the output port OUTPUT is kept the same as that before the reset phase T4 which is a high level retained by a large parasitic capacitance on the output port.

The output cut-off phase T5 actually includes a first period T51. During this first output cut-off period T51, STVG and CK2 are high-voltage Off signals. CK1 and EM are low-voltage On signals. CK1 controls M1 being turned on to pass low-voltage EM to C1 and turns M1 on to pass high-voltage VGH to the output port OUTPUT. Also, EM controls M3 being turned on to write high-voltage VGH to C2 and keep M5 at an Off state. During a subsequent second output cut-off period T52, STVG and CK1 are high-voltage Off signals and CK2 and EM are low-voltage On signals. The low-voltage CK2 controls M2 being turned on to write high-voltage STVG to C2. EM controls M4 being turned on to write high-voltage VGH to C2, keeping M5 at an Off state. The gate potential level of the first output, transistor M4 is maintained by C1 at the low level set during the first output cut-off period T51, which keeps M4 at an On state to continue write high-voltage VGH to the output port OUTPUT.

After this period T52 and before a next period of scanning operation executed by the shift register unit as disclosed throughout the specification, the shift register unit is operated to continue cycling multiple of the first period T51 followed by a second period T52 mentioned above to keep the output port OUTPUT to receive VGH at high voltage until a total time period of the output cut-off phase ends.

Figure 6:
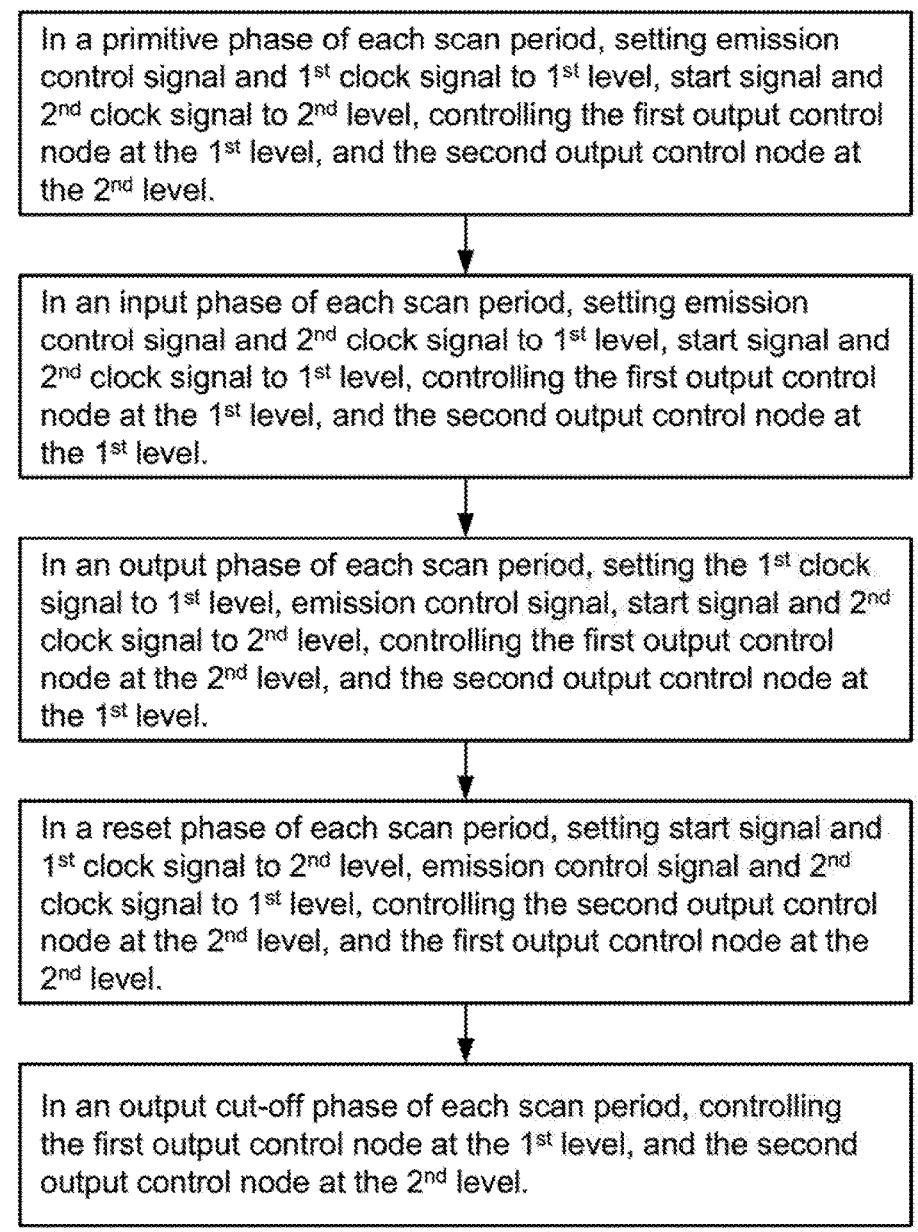
FIG. 6 is a flow chart showing a method for driving the shift register unit according to some embodiments of the present disclosure.

FIG. 6 is a flow chart showing a method for driving the shift register unit according to some embodiments of the present disclosure. In an embodiment, the driving method is applied to the shift register unit as shown in FIG. 1 through FIG. 4 under controls of various control signals varied over entire scan period depicted in FIG. 5. The method includes a primitive step: in a primitive phase of each scan period, the step includes setting an emission control signal and a first clock signal to a first potential level (first level) and setting a start signal and a second clock signal to a second potential level (second level). Further the step includes using a first output node control sub-circuit to control the emission control signal being written in a first output control node so as to control a potential level of the first output control node to be the first level. Additionally, the step includes using a second output node control sub-circuit to control the second level being applied to a second output control node.

Further the method includes an input step: in an input phase of each scan period, the step includes setting the start signal and the second clock signal to the first level and setting the emission control signal and the second clock signal to the second level. Further, the step includes using the first output node control sub-circuit to maintain the potential level of the first output control node at the first level. Additionally, the step includes using the second output node control sub-circuit to control the start signal being applied to the second output control node so as to control the potential level of the second output control node to the first level.

Additionally, the method includes an output step: in an output phrase of each scan period, the step includes sating the first clock signal to the first level and setting the second clock signal, the start signal, and, the emission control signal to the second level. Further, the step includes using the first output node control sub-circuit to control the emission control signal being applied to the first output control node so as to control the potential level of the first output control node to the second level. Additionally, the step includes using the second output node control sub-circuit to maintain the potential level of the second output control node at the first level.

Furthermore, the method includes a reset step: in a reset phase of each scan period, the step includes setting the first clock signal and the start signal to the second level and setting the second clock signal and the emission control signal to the first level. Further, the step includes using the second output node control sub-circuit to control the emission control signal and the second level being applied to the second output control node so as to control the potential level of the second output control node to the second level. Additionally, the step includes using the first output node control sub-circuit to maintain the potential level of the first output control node at the second level.

Moreover, the method includes an output cut-off step: in an output cut-off phase of each scan period, the step includes using the first output node control sub-circuit to control the potential level of the first output control node to the first level and using the second output node control sub-circuit to control the potential level of the second output control node to the second level.

In some embodiments, the method for driving the shift register unit of the present disclosure utilizes the emission control signal on the emission control line as a trigger signal for controlling the potential level of the first output control node and the second output control node. By coupling the emission control line with the scanning shift register unit, the driving signal can be generated and at the same time the circuitry structure of the scanning shift register unit is simplified.

Referring to FIG. 6, the output cut-off step further includes a first sub-step: in a first cut-off period of the output cut-off phase, the sub-step includes setting the first clock signal and the emission control signal to the first level and setting the second clock signal and the start signal to the second level. Further, the sub-step includes using the first output node control sub-circuit to control the emission control signal being applied to the first output control node so as to control the potential level of the first output control node to the first level. Additionally, the sub-step includes using the second output node control sub-circuit to control the second level being applied to the second output control node.

Further, the output cut-off step further includes a second sub-step: in a second cut-off period of the output cut-off phase, the sub-step includes setting the second clock signal and the emission control signal to the first level and setting the first clock signal and the start signal to the second level. Further, the sub-step includes using the first output node control sub-circuit to maintain the potential level of the first output control node at the first level. The sub-step additionally includes using the second output node control sub-circuit to control the second level being applied to the second output control node.

Furthermore, at the end of performing the second sub-step, the output cut-off step further includes performing the first sub-step again, and continuing the cycle within entire time period given to the output cut-off step until the output cut-off phase ends.

In some embodiments, the method includes a maintaining step between the output step and the reset step. In particular, the maintaining step, in a gap period between the output phase and the reset phase of each scan period, includes setting the first clock signal, the second clock signal, the start signal, and the emission control signal to the second level. Further, the maintaining step includes using the second output node control sub-circuit to maintain the potential level of the second output control node at the first level. In the gap period between the output phase and the reset phase, the potential level of the second output control node is kept at the first level so that the driving signal outputted from an output port of the shift register unit is pulled up from a low voltage level to a high voltage level. Here, the first level is the low voltage level and the second level is the high voltage level.

In some embodiments, the primitive step of the method also includes using the first output sub-circuit to control the driving signal outputted from the output port of the shift register unit to be the second level.

In some embodiments, the input step of the method also includes using the first output sub-circuit to control the output port being connected to a second voltage input port to receive a voltage signal at the second level. Further, the input step includes using a second output sub-circuit to control the output port being connected to a first clock input port to receive the first clock signal. Furthermore, the input step includes using both the first output sub-circuit and the second output sub-circuit to control the output port to output the second level.

In some embodiments, the output step of the method further includes using the second output sub-circuit to control the output port being connected to the first clock input port to receive the first clock signal so as to control the output port to output the driving signal at the first level.

In some embodiments, the maintaining step of the method further includes using the second output sub-circuit to control the output port being connected to the first clock input port to receive the first clock signal so as to control the output port to output the second level.

In some embodiments, the reset step of the method further includes using the first output sub-circuit and the second output sub-circuit to control the output port to continue outputting the second level.

In some embodiments, the output cut-off step of the method further includes using the first output sub-circuit to control the output port to output the second level.

In an alternative aspect, the present disclosure also provides a scanning shift register circuit made by multiple stages of shift register units as shown above through FIG. 1 to FIG. 6. The scanning shift register circuit includes a plurality of shift register units cascaded together.

In another alternative aspect, the present disclosure provides an array substrate including a plurality of emission control lines and a plurality of gate lines. The array substrate includes the scanning shift register circuit configured with the plurality of emission control lines and the plurality of gate lines. The scanning shift register circuit includes a plurality of shift register units cascaded together. Each shift register unit is coupled to one of the plurality of emission control lines for generating a driving signal for one of the plurality of gate lines.

More specifically, the array substrate includes emission control lines, gate lines, and a scanning shift register. The emission control lines are connected to the scanning shift register. Emission control signals from the emission control lines are provided as trigger signals for each shift register unit within the scanning shift register so that the scanning shift register is simplified in circuitry.

In additional alternative aspect, the present disclosure provides a display panel including the array substrate taught above.

In yet another alternative aspect, the present disclosure provides a display apparatus including the display panel mentioned above.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A shift register unit for providing a driving signal for a gate line of an array substrate, the shift register unit comprising:
   an output port for a driving signal;
   a first output node control sub-circuit coupled to an emission control line, a first clock input port, and a first output control node respectively, and configured to control a potential level of the emission control signal being applied from the emission control line to the first output control node when a first clock signal from the first clock input port is at a first level and to maintain the potential level of the first output control node when the first clock signal is at a second level;
   a first output sub-circuit coupled to the first output control node, the output port, and a second voltage input port respectively, the second voltage input port supplying a potential level at the second level;
   a second output node control sub-circuit coupled to the emission control line, the second voltage input port, a second clock input port, a primitive signal input port, and a second output control node respectively, and configured to control a start signal from the primitive signal input port being applied to the second output control node when a second clock signal from the second clock input port is at the first level, to control the second level being applied to the second output control node when the potential level of the emission control signal is at the first level, and to maintain the potential level of the second output control node when both the first clock signal and the potential level of the emission control signal are at the second level; and
   a second output sub-circuit coupled to the second output control node, the output port, and the first clock input port respectively.

2. The shift register unit of claim 1, wherein the first output sub-circuit is configured to control the potential level at the second level being outputted at the output port when the potential level of the first output control node is at the first level; the second output sub-circuit is configured to control the first clock signal being outputted at the output port when the potential level of the second output control node is at the first level.

3. The shift register unit of claim 2, wherein the first output node control sub-circuit comprises:
   a first control transistor having a gate connected to the first clock input port, a first terminal connected to the emission control line, and the second terminal connected to the first output control node;
   a first capacitor having a first terminal connected to the second voltage input port and a second terminal connected to the first output control node.

4. The shift register unit of claim 2, wherein the second output node control sub-circuit comprises:
   a second control transistor having a gate connected to the second clock input port, a first terminal connected to the primitive signal input port, and a second terminal connected to the second output control node;
   a third control transistor having a gate connected to the emission control line, a first terminal connected to the second output control node, and the second terminal connected to the second voltage input port; and
   a second capacitor having a first terminal connected to the output port and a second terminal connected to the first clock input port.

5. The shift register unit of claim 2, wherein the first output sub-circuit comprises a first output transistor having a gate connected to the first output control node, a first terminal connected to the output port, and a second terminal connected to the second voltage input port; the second output sub-circuit comprises a second output transistor having a gate connected to the second output control node, a first terminal connected to the first clock input port, and a second terminal connected to the output port.

6. A method for driving a shift register unit of claim 1 in each period for scanning a subpixel including a primitive phase, an input phase, an output phase, a reset phase, and an output cut-off phase, the method comprising:
   in the primitive phase, setting potential levels of the emission control signal and the first clock signal to the first level, setting potential levels of the start signal and the second clock signal to the second level, applying the emission control signal at the first level to the first output control node controlled by the first output node control sub-circuit, controlling the potential level of the first output control node at the first level, and applying the second level to the second output control node controlled by the second output node control sub-circuit;
   in the input phase, setting potential levels of the start signal and the second clock signal to the first level, setting potential levels of the emission control signal and the first clock signal to the second level, maintaining the first output control node at the first level controlled by the first output node control sub-circuit, controlling the start signal being received by the second output control node controlled by the second output node control sub-circuit for controlling the second output control node to be at the first level;
   in the output phase, setting potential level of the first clock signal to the first level, setting potential levels of the second clock signal, the start signal, and the emission control signal to the second level, controlling the first output control node to receive the emission control signal controlled by first output node control sub-circuit for controlling the first output control node to the second level, maintaining the second output control node at the first level controlled by the second output node control sub-circuit;
   in the reset phase, setting potential levels of the first clock signal and the start signal to the second level, setting potential levels of the second clock signal and the emission control signal to the first level, controlling the second level of the start signal being applied to the second output control node controlled by the second output node control sub-circuit for controlling the second output control node to the second level, maintaining the first output control node to the second level controlled by the first output node control sub-circuit; and
   in the output cut-off phase, controlling the first output control node to the first level controlled by the first output node control sub-circuit, controlling the second output control node to the second level controlled by the second output node control sub-circuit.

7. The method of claim 6, wherein, in a first period of the output cut-off phase, setting potential levels of the first clock signal and the emission control signal to the first level, setting potential levels of the second clock signal and the start signal to the second level, controlling the emission control signal being applied to the first output control node controlled by the first output node control sub-circuit for controlling the first output control node to the first level, controlling the second level being applied to the second output control node controlled by the second output node control sub-circuit; in a second period of the output cut-off phase, setting potential levels of the second clock signal and the emission control signal to the first level, setting potential levels of the first clock signal and the start signal to the second level, controlling the first output control node to the first level controlled by the first output node control sub-circuit, and controlling the second level being applied to the second output control node controlled by the second output node control sub-circuit; restarting a first period of the output cut-off phase after the end of the second period of the output cut-off phase followed by a second period of the output cut-off phase again until a total time period of the output cut-off phase ends.

8. The method of claim 7, further comprising, in a maintaining phase between the output phase and the reset phase, setting potential levels of the first clock signal, the second clock signal, the start signal, and the emission control signal to the second level and maintaining the second output control node at the first level controlled by the second output node control sub-circuit.

9. The method of claim 6, further comprising, in a maintaining phase between the output phase and the reset phase, setting potential levels of the first clock signal, the second clock signal, the start signal, and the emission control signal to the second level and maintaining the second output control node at the first level controlled by the second output node control sub-circuit.

10. The method of claim 9, further comprising, in the primitive phase, driving the first output sub-circuit to control the output port to output the driving signal at the second level.

11. The method of claim 9, further comprising, in the input phase, connecting the output port to the second voltage input port controlled by the first output sub-circuit, connecting the output port to the first clock input port controlled by the second output sub-circuit, and controlling output port to output the driving signal at the second level commonly controlled by the first output sub-circuit and the second output sub-circuit.

12. The method of claim 9, further comprising, in the output phase, connecting the output port to the first clock input port controlled by the second output sub-circuit for controlling the output port to output the driving signal at the first level.

13. The method of claim 9, further comprising, in the maintaining phase, connecting the output port to the first clock input port controlled by the second output sub-circuit for controlling the output port to output the driving signal at the second level.

14. The method of claim 9, further comprising, in the reset phase, controlling the output port to continue outputting the driving signal at the second level controlled by the first output sub-circuit and the second output sub-circuit.

15. The method of claim 9, further comprising, in the output cut-off phase, controlling the output port to output the driving signal at the second level controlled by the first output sub-circuit.

16. An array substrate comprising a plurality of emission control lines and a plurality of gate lines, and a plurality of shift register units of claim 1, each of the plurality of shift register units being coupled to one of the plurality of emission control lines and being configured to generate a driving signal outputted to one of the plurality of gate lines.

17. A display panel comprising an array substrate of claim 16.

18. A display apparatus comprising a display panel of claim 17.

* * * * *